(12) United States Patent
Fujikawa et al.

(10) Patent No.: US 8,124,301 B2
(45) Date of Patent: Feb. 28, 2012

(54) GRADATED PHOTOMASK AND ITS FABRICATION PROCESS

(75) Inventors: Junji Fujikawa, Tokyo (JP); Shu Shimada, Tokyo (JP); Yuuichi Yoshida, Tokyo (JP); Shiho Sasaki, Tokyo (JP); Tsuyoshi Amano, Tokyo (JP); Kimio Ito, Tokyo (JP); Nobuhito Toyama, Tokyo (JP); Hiroshi Mohri, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 419 days.

(21) Appl. No.: 12/066,203

(22) PCT Filed: Sep. 19, 2006

(86) PCT No.: PCT/JP2006/318892
§ 371 (c)(1),
(2), (4) Date: Apr. 6, 2009

(87) PCT Pub. No.: WO2007/034930
PCT Pub. Date: Mar. 29, 2007

(65) Prior Publication Data
US 2009/0220867 A1    Sep. 3, 2009

(30) Foreign Application Priority Data
Sep. 21, 2005    (JP) ................................. 2005-273601

(51) Int. Cl.
*G03F 1/00* (2006.01)
*G03F 9/00* (2006.01)

(52) U.S. Cl. .......................................... 430/5; 430/322

(58) Field of Classification Search ............... 430/5, 322, 430/323, 324; 716/19, 20, 21; 378/35
See application file for complete search history.

(56) References Cited

U.S. PATENT DOCUMENTS

| 6,787,274 B2 * | 9/2004 | Park .................................. 430/5 |
| 7,745,842 B2 * | 6/2010 | Nozute ........................... 257/98 |
| 2004/0197677 A1 * | 10/2004 | Kohle et al. ...................... 430/5 |
| 2005/0186487 A1 * | 8/2005 | Inazuki et al. .................... 430/5 |

FOREIGN PATENT DOCUMENTS

| JP | 2005-91855 A | 4/2005 |
| JP | 2005-181827 A | 7/2005 |

* cited by examiner

*Primary Examiner* — Stephen Rosasco
(74) *Attorney, Agent, or Firm* — Sughrue Mion, PLLC

(57) ABSTRACT

The invention provides a gradated photomask for reducing photolithography steps and its fabrication process, which make use of a generally available photomask blank, prevents the reflectance of a light shield film from growing high, makes alignment easy during the formation of a semitransparent film, and enables the semi-transparent film on a light shield pattern with good step coverage. A photomask (100) comprises a mixture of a light shield area including a light shield film (114) having a desired pattern on a transparent substrate wherein a film forming the pattern is substantially opaque to photolithographic light, a semitransparent film (113) that transmits the photolithographic light at a desired transmittance, and the light shield film (114) and the semitransparent film (113) are stacked on the transparent substrate (101) in that order; a semi-transparent area wherein there is only the semitransparent film (113); and a transmissive area there is neither the light shield film (114) nor the semitransparent film (113), and is characterized in that the semitransparent film (113) has an antireflection function with respect to the photolithographic light.

10 Claims, 8 Drawing Sheets

GRADATED PHOTOMASK AND ITS FABRICATION PROCESS

CROSS REFERENCE TO RELATED APPLICATIONS

This application is a National Stage of International Application No. PCT/JP2006/318892 filed on Sep. 19, 2006, claiming priority based on Japanese Patent Application No. 2005-273601, filed Sep. 21, 2005, the contents of all of which are incorporated herein by reference in their entirety.

ART FIELD

The present invention relates generally to a photolithography technique used for the formation of patterns such as semiconductor devices or image display devices, and more particularly to a gradated photomask used with a fabrication technique wherein, instead of implementing multiple lithographic steps using multiple photomasks, one single gradated photomask is used to form a resist profile having levels dependent on the quantity of transmitted light through it, thereby cutting down the lithographic steps count involved, and its fabrication process.

BACKGROUND ART

Regarding pattern formation processes for diminishing the number of lithographic steps for the aforesaid semiconductor devices or image display devices represented by liquid crystal display devices (LCDs), for instance, Patent Publications 1 and 2 disclose a process with which the lithographic cycles count involved is cut down by a reflow technique, or by an ashing technique.

The aforesaid publications also give an account of a photomask having a micro-slit below the resolution limits for photolithographic light used (hereinafter called the slit mask), and a photomask having gradations with respect to photolithographic light (hereinafter referred to as the gray tone mask).

However, there is a grave problem with the fabrication of the aforesaid slit mask and conventional gray tone mask (hereinafter referred to as the prior art gray tone mask).

With the slit mask, a general light shield film capable of substantially shielding off photolithographic light, for instance, a chromium film is used and the micro-slit below the resolution limits is located at an area that is made semitransparent on a mask (for instance, see Patent Publication 3; although the mask of Patent Publication 3 is described as a gray tone mask, it is indeed a so-called slit mask). The slit in this mask, because of having a size less than the resolution limits, allows size-dependent photolithographic light to transmit through an area including a surrounding non-opening portion without forming its own image on a resist. For this reason, the slit mask functions as if there were a semitransparent film in the area with the slit formed and an area including the surroundings.

However, the slit, because of being required to be below the resolutions limits, must as a matter of course be finished to a size smaller than the main pattern of the mask, offering a grave problem that it gives an increased load on mask fabrication.

To make a wider area transparent, a lot more slits must be disposed resulting in an increase in the capacity of pattern data, which gives rise to a problem that there is an increased load on pattern formation steps and pattern defect inspection steps. This problem in turn leads to another problem such as an extended fabrication and inspection time length and an increased mask fabrication cost.

On the other hand, the prior art gray tone mask is one that uses a film capable of substantially shielding off photolithographic light plus the second film semi-transparent to photolithographic light, producing gradations (for instance, see Patent Publication 4). To fabricate this mask, an exclusive photomask blank wherein a semitransparent film and a light shield film have been stacked on a transparent substrate beforehand is used to repeat mask pattern making twice. In the first mask pattern making operation here, the light shield film and semitransparent film are etched in a stroke, and in the second mask pattern making operation, only the light shield film is etched so that the desired mask can be fabricated. Alternatively, only the light shield film may be etched in the first mask pattern making operation and, in the second mask pattern making operation, the light shield film and semitransparent film may be etched in a stroke. This prior art gray tone mask is advantageous over the slit mask in that, unlike the slit mask, there is no need of providing the micro-slit.

However, there is the need of relying upon the etching technique where, as described above, only the light shield film is removed to leave the semitransparent film behind, but there is a problem that any etching selection ratio is unavailable. For the prior art gray tone mask, there are thus some limitations to material selection for the light shield films and semitransparent films: some limited materials alone are usable, or there is no option but to provide an etching stopper layer on the semitransparent film and then provide the light shield layer on it. To make etching selection viable, there is another need of having multiple etching techniques (multiple installations, liquid chemicals, gases, etc.) at hand, which in turn offers further problems winding up with a lot more fabrication installations and steps, and mounting mask fabrication costs.

To provide a solution to the aforesaid problems, Applicant has already filed Japanese Patent Application No. 2004-195602 to come up with a gradated photomask comprising a mixture of a light shield area where a light shield film and a semitransparent film are stacked on a transparent substrate in that order, a light shield area where there is only a light shield film, a semitransparent area where there is only a semitransparent film, and a transmissive area where there is neither a light shield film nor a semitransparent film, and its fabrication process. Japanese Patent Application No. 2004-195602 says that a chromium type material generally used for photomasks is desired for the light shield layer, and a film of oxide, nitride, carbide or the like of chromium is preferable for the semitransparent film.

Patent Publication 1: U.S. Pat. No. 3,415,602
Patent Publication 2: JP(A)2002-66240
Patent Publication 3: JP(A)2002-196474
Patent Publication 4: JP(A)2002-189280

In the photolithographic step using a photomask, on the other hand, photolithographic light is reflected off the surface of the light shield film during exposure, giving rise to stray light that offers a problem that transfer precisions falls away. To get around this problem, generally available photomask blanks make much use of a double-layer arrangement having a low-reflective film stacked and formed on the surface of the light shield film. Ordinarily, a chromium film, a chromium nitride film or the like of about 50 to 150 nm in thickness is used as the light shield film, and a chromium oxide film or the like of about 20 nm in thickness is used as the low-reflective film.

As described in Japanese Patent Application No. 2004-195602, however, Applicant has now found that such problems as mentioned below arise with the fabrication of gradation photomasks using the two-layer structure mask blank having a low-reflective film on the light shield film.

The low-reflective film provided on the light shield layer has a reflectance optimized by its film quality and thickness; however, as the semitransparent film is further formed on the surface having the light shield film and low-reflective film, it gives rise to a problem that there is a reflectance change that renders the low-reflective film less effective, often resulting in an increased reflectance.

Further, when a semitransparent film pattern is formed, a reference mark previously formed in a light shield film pattern is read on a writing system at an alignment writing step to write a semitransparent film pattern in association with the read position; however, when there is the low-reflective film formed on the surface of the light shield film, there is often a problem that the reference mark formed in the light shield film is illegible on the writing system.

Still further, when a generally available photomask blank 600 of a two-layer structure, wherein, as shown typically in FIG. 8(a), a light shield film 602 of chromium nitride and a low-reflective film 603 of chromium oxide are provided on a transparent substrate 601, is used as the photomask blank, pattern etching using wet etching causes an edge portion 605 of a light shield film pattern 604 to have a reverse taper form by side etching, as shown in FIG. 8(b). Then, as shown in FIG. 8(c), as a semitransparent film 607 is formed all over the surface of the substrate while covering a low-reflective film pattern 606, it causes the semitransparent film 607 to be not deposited onto the reverse taper edge portion: the semitransparent film 607 cannot often be formed with good step coverage, often resulting in defects.

SUMMARY OF THE INVENTION

In view of the problems indicated in the aforesaid Japanese Patent Application No. 2004-195602, the invention has been made. That is, the invention provides a gradated photomask for reducing a photolithographic steps count, which uses a generally available photomask blank without recourse to any exclusive photomask blank material to prevent the reflectance of a light shield film from growing high, makes it easy to read a reference alignment mark at the time of forming a semitransparent film pattern, and allows a semitransparent film to be formed on a light shield film pattern with good step coverage, and its fabrication process.

According to the invention of claim 1, the object of the invention is accomplishable by the provision of a gradated photomask comprising a mixture of a light shield area including a light shield film having a desired pattern on a transparent substrate wherein a film forming said pattern is substantially opaque to photolithographic light, a semitransparent film that transmits said photolithographic light at a desired transmittance, and said light shield film and said semitransparent film are stacked on said transparent substrate in that order; a semitransparent area wherein there is only said semitransparent film; and a transmissive area wherein there is neither said light shield film nor said semitransparent film, characterized in that said semitransparent film has an antireflection function with respect to said photolithographic light.

According to the invention of claim 2, the gradated photomask recited in claim 1 is further characterized in that said semitransparent area wherein there is only said semitransparent film has a transmittance of 15% to 85% with respect to said photolithographic light.

According to the invention of claim 3, the gradated photomask recited in claim 1 or 2 is further characterized in that said light shield area wherein said light shield film and said semitransparent film are stacked in that order has a reflectance of less than 30% with respect to said photolithographic light.

According to the invention of claim 4, the gradated photomask recited in any one of claims 1, 2 and 3 is further characterized in that said semitransparent film has an antireflection function with respect to a wavelength that at least one of g-line, h-line, i-line, KrF excimer laser, and ArF excimer laser has.

According to the invention of claim 5, the gradated photomask recited in any one of claims 1 to 4 is further characterized in that said light shield film and said semitransparent film are each mainly composed of chromium.

According to the invention of claim 6, the gradated photomask recited in claim 5 is further characterized in that said light shield film comprises chromium or chromium oxide, and said semitransparent film comprises chromium oxide or chromium oxide nitride.

According to the invention of claim 7, there is provided a process of fabricating a gradated photomask including a light shield film having a desired pattern on a transparent substrate, wherein a film forming said pattern is substantially opaque to photolithographic light, and a semitransparent film that transmits said photolithographic light at a desired transmittance, which is characterized by comprising, in order described below, a step of providing a mask blank wherein said light shield film is formed on said transparent substrate, a step of patterning said light shield film, a step of forming a semitransparent film having an antireflection function with respect to said photolithographic light all over the surface of said transparent substrate having said patterned light shield film, and a step of patterning said semitransparent film having an antireflection function.

According to the invention of claim 8, there is provided a process of fabricating a gradated photomask comprising a light shield film having a desired pattern on a transparent substrate wherein a film forming said pattern is substantially opaque to photolithographic light, and a semitransparent film that transmits said photolithographic light at a desired transmittance, characterized by comprising, in order described below, a step of providing a mask blank of two films or a light shield film and a low-reflective film on said transparent substrate, a step of etching said low-reflective film to expose out said light shield film, a step of patterning said light shield film, a step of forming a semitransparent film having an antireflection function with respect to said photolithographic light all over the surface of said transparent substrate having said patterned light shield film, and a step of patterning said semitransparent film having an antireflection function.

According to the invention of claim 9, the gradated photomask fabrication process recited in claim 7 or 8 is characterized by further comprising a step of re-patterning said exposed light shield film after the step of patterning said semitransparent film having an antireflection function.

According to the invention of claim 10, the gradated photomask fabrication process recited in any one of claims 7 to 9 is characterized by further implementing mask pattern inspection for said light shield film and, if required, a correction step after the step of patterning said light shield film.

The gradated photomask of the invention, because the semitransparent film itself has an antireflection function and so there is no need of providing any low-reflective film on the light shield film, enables the mask structure to be simplified. Further, because the semitransparent film is formed on the edge portion of the light shield film pattern, too, with good step coverage, the edge portion of the mask pattern is kept smooth so that photomasks having gradations of high quality can be obtained at low costs.

By use of the inventive gradated photomask, the photolithography steps count can efficiently be cut down and so low-cost semiconductor devices or image display devices are achievable.

With the inventive gradated photomask fabrication process wherein photomask blanks of a conventional chromium type material can be used without recourse to exclusive photomask blanks, fabrication can be implemented at existing mask fabrication steps on existing fabrication installations. Moreover, at the alignment writing step of the mask fabrication process, the reference mark in the light shield film pattern below the semitransparent film is positively visible so that alignment precision can be improved and photomasks having gradations of high quality are achievable at low costs.

BEST MODE FOR CARRYING OUT THE INVENTION

Embodiments of the gradated photomask of the invention and its fabrication process are now explained with reference to the drawings.

Figure 1:
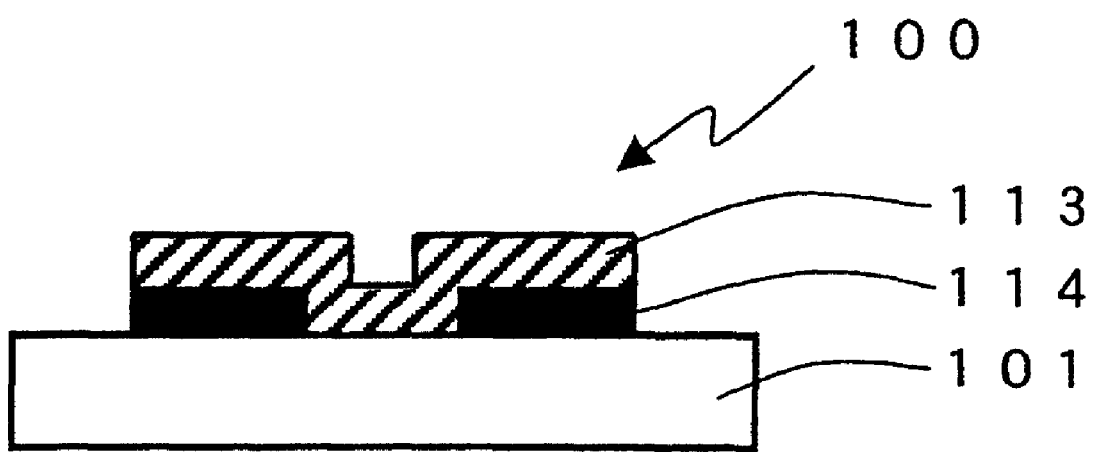
FIG. 1 is illustrative in sectional schematic of one embodiment of the gradated photomask of the invention.

FIG. 1 is a sectional schematic of one embodiment of the gradated photomask of the invention.

Figure 2:
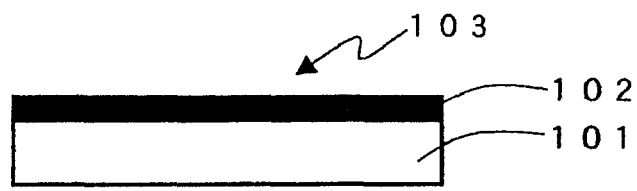
FIG. 2 is illustrative in sectional schematic of one fabrication process of the gradated photomask of the invention depicted in FIG. 1.
Figure 2:
Figure 2:
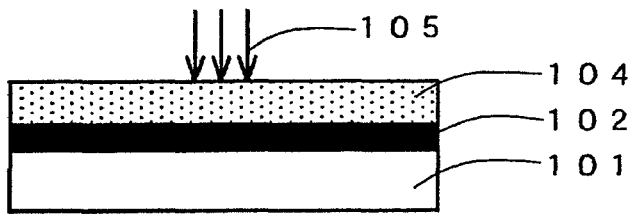
Figure 2:
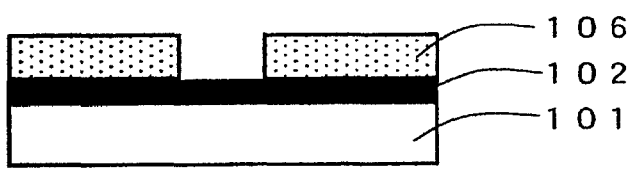
Figure 2:
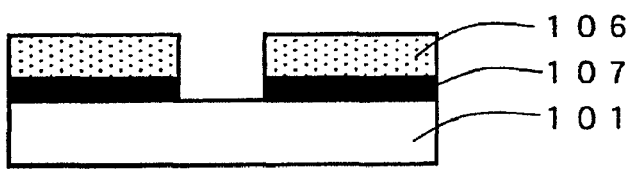
Figure 2:
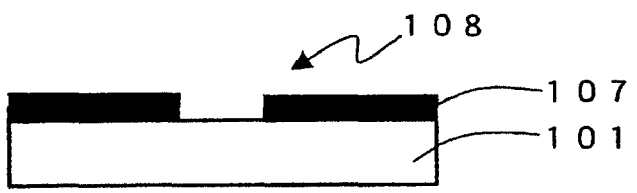
Figure 2:
Figure 4:
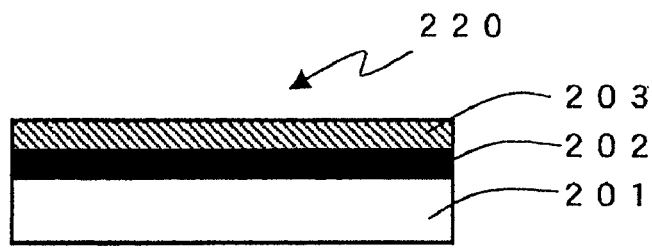
FIG. 4 is illustrative in sectional schematic of another fabrication process of the gradated photomask of the invention.
Figure 4:
Figure 4:
Figure 4:
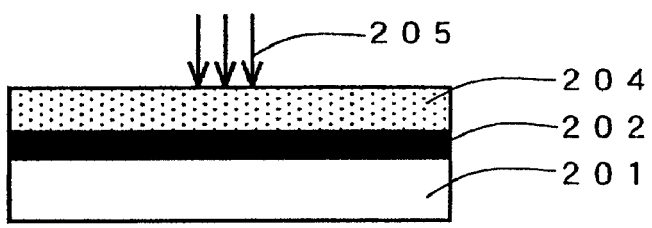
Figure 4:
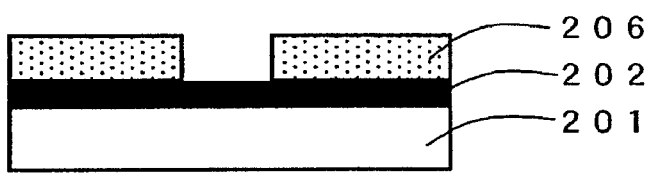
Figure 4:
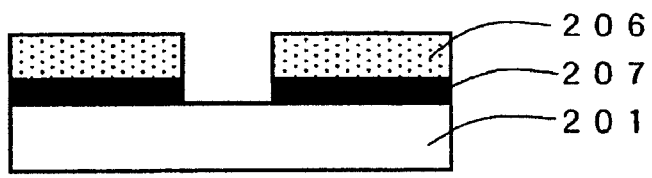
Figure 4:
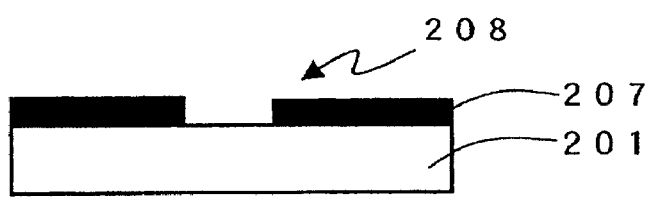
Figure 5:
FIG. 5 is illustrative in sectional schematic of photomask fabrication steps subsequent to FIG. 2.
Figure 5:
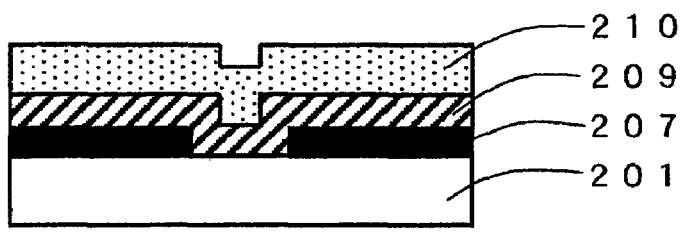
Figure 5:
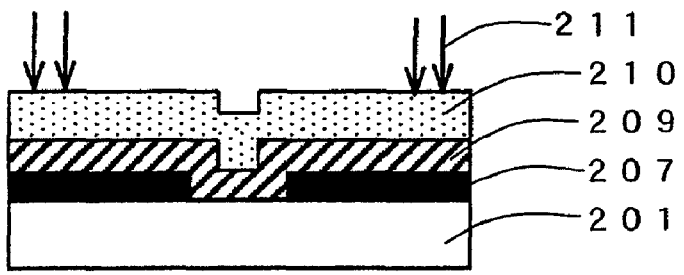
Figure 5:
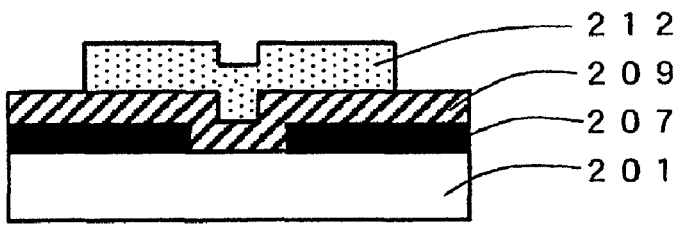
Figure 5:
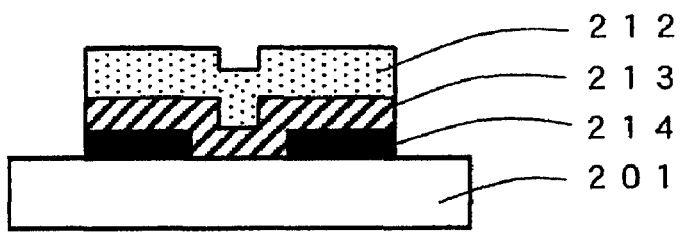
Figure 5:
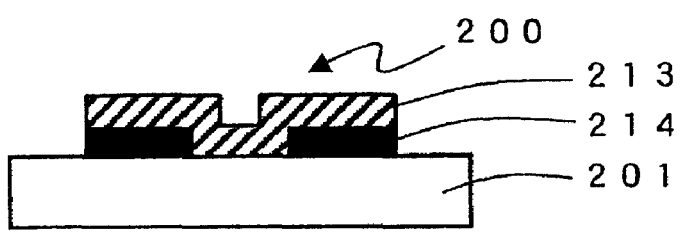

FIG. 2 and FIG. 3 subsequent to it are illustrative in sectional schematic of the process steps of the gradated photomask according to the invention depicted in FIG. 1. FIG. 4 and FIG. 5 subsequent to it are illustrative in sectional schematic of another embodiment of the fabrication process of the gradated photomask according to the invention.
(Gradated Photomask)

As depicted in FIG. 1, a gradated photomask 100 of the invention includes the desired pattern on a transparent substrate 101. A film that forms the pattern comprises a light shield film pattern 114 that is substantially opaque to photolithographic light and a semitransparent film pattern 113 that is transparent to photolithographic light at the desired transmittance. On the transparent substrate 101, there are a light shield area comprising light shield film pattern 114 and semitransparent film pattern 113 stacked one upon another in that order, a semitransparent area where there is only semitransparent film pattern 113, and a transmissive area there is neither the light shield film pattern 114 nor the semitransparent film pattern 113.

In the invention, the "light shield film pattern that is substantially opaque to photolithographic light" means that it does not transmit photolithographic light at a photolithographic light wavelength in one single photolithographic operation and, hence, does not make a photosensitive resist sensitive to photolithographic light: usually, that light shield film pattern is preferably supposed to have a transmittance of 0.1% or lower at a photolithographic light wavelength.

As depicted in FIG. 1, on the pattern-etched semitransparent film side of the light shield area having the light shield film pattern 114 and semitransparent film pattern 113 stacked one upon another in that order, the edge portion of the light shield film pattern 114 is the same in position as the edge portion of the semitransparent film pattern 113.

For the transparent substrate 101 of the gradated photomask 110 of the invention, use may be made of optically polished glasses ordinarily used for photomasks, for instance, soda lime glass, low expansion glasses such as borosilicate glass or alumino-borosilicate glass, synthetic quartz glass, fluorite, and calcium fluoride. When the photolithographic light used has a short wavelength, it is preferable to use synthetic quartz glass.

For the light shield film that constitutes the light shield film pattern 114, any desired thin film may be used provided that it is usable as an ordinary mask material: thin films based on chromium, molybdenum silicide, tantalum, aluminum, silicon, silicon oxide nitride or the like may be used. In view of the cost and quality of mask blanks, however, it is most preferable to use a chromium type film composed mainly of chromium, because it is the most tried-and-true one. For the chromium type film, use is usually made of a single layer film made of a material selected from chromium, chromium oxide, chromium nitride, and chromium oxide nitride; however, it is more preferable to use a chromium type film because of ease of formation and high general versatility, and a chromium nitride film because of ease of stress reductions. For instance, when chromium is used as the light shield film, it is used in the thickness range of about 50 nm to about 150 nm.

In the invention, for the semitransparent film that constitutes the semitransparent film pattern 113, use is made of an oxide film, a nitride film, a carbide film that is a light shield film that forms the aforesaid light shield pattern 114. To take the advantage of being capable of patterning the semitransparent film and the light shield film with the same etching installation and steps, however, it is preferable that the semitransparent film is made of the material of the same type as that of the light shield film. When the chromium type material is used as the material preferable for the light shield film as mentioned above, a film that contains chromium plus oxygen, nitrogen, carbon, etc. and has a relatively high transmittance is used for the semitransparent film: its composition and thickness may just as well be optimized in such a way as to reduce its reflectance upon stacked on the light shield film. Among the semitransparent films of the chromium type, a lot more preference is given to a chromium oxide or chromium oxide nitride film that is relatively easy to control both transmittance and anti-reflection function. For instance, when the chromium oxide film is used as the semitransparent film, it is used at a film thickness of about 5 nm to 150 nm. As the film thickness is less than 5 nm or greater than 150 nm, the semitransparent film is less likely to make a significant transmittance difference with the light shield film. A semitransparent film containing oxygen, nitrogen, carbon or the like has its absorbance varying with composition; the desired transmittance and antireflection function are achievable by controlling its film thickness and composition at the same time.

In the invention, the transmittance to photolithographic light of the semitransparent film that forms the semitransparent film pattern 113 is preferably in the range of 15% to 85%. At a transmittance less than 15%, the semitransparent area where there is only the semitransparent film is less likely to make a significant difference with the light shield area upon resist pattern formation using the inventive gradated photomask. At a transmittance greater than 85%, on the other hand, the semitransparent area is less likely to make a significant difference with the transmittance area upon resist pattern formation.

In the invention, the antireflection function of the semitransparent film of the gradated photomask is effective to a wavelength that at least one of g-line (436 nm), h-line (405 nm) and i-line (365 nm) of light, KrF excimer laser (248 nm) and ArF excimer laser (193 nm) given out of ultra-high pressure mercury lamps or the like has. More preferably, that antireflection function is effective to two or more wavelengths as in g-line or i-line.

Usually, when the light shield film pattern is formed of a metal film such as a chromium film and the light shield film has none of the antireflection function to photolithographic light, there is a reflectance of 30% or higher that gives rise to stray light.

In the invention, the reflectance to photolithographic light of the light shield area where there is the light shield pattern 114 with the semitransparent film pattern 113 stacked on it is preferably less than 30%. At a reflectance of greater than 30%, the resolution of the photoresist pattern drops under the influence of stray light upon photomask lithography. A reflectance of less than 30% would make sure the practically undisturbed antireflection function.

(Fabrication of the Gradated Photomask)

Embodiments of how to fabricate the gradated photomask according to the invention are now explained.

First Embodiment

FIG. 2 is a sectional schematic of the process steps of fabricating the inventive gradated photomask 100 shown in FIG. 1, and FIG. 3 subsequent to it is a sectional schematic of the process steps of fabricating the gradated photomask according to the invention.

To fabricate the gradated photomask according to the embodiment here, there is a photomask blank 103 first readied up, in which the first or light shield film 102 is formed on a transparent substrate 101 (FIG. 2(a)). If the light shield film 102 of the photomask blank 103 is a chromium or chromium nitride film, the chromium or chromium nitride film is formed by sputtering. Usually, this is used as the photomask blank and easily available.

Then, the aforesaid photomask blank 103 is subjected to the first mask pattern making according to a conventional manner so that the first or light shield film 102 is patterned. That is, a resist such as a photosensitive resist compatible with an aligner such as a laser aligner is coated on the light shield layer 102, and after coating, baking is applied to it for a given time to form a resist film 104 of uniform thickness for the light shield film (FIG. 2(b)).

It is here noted that the mask aligner includes an EB aligner and a laser aligner, each usable in the invention. However, with an increase in the sizes of display systems such as LCDs or PDPs and the application of multiple planes at the time of fabrication, there is also an increase in photomask size; the laser aligner is mainly used for photomasks for image display devices.

Then, pattern writing is applied to the resist film 104 on the light shield film, using an energy beam 105 such as laser light (FIG. 2(c)). In the embodiment here, this pattern writing is implemented such that only a boundary at which the light shield film area comes in direct contact with the semitransparent film area to be formed at the post-step, thereby patterning a part of the light shield film 102. Pattern writing for the batch etching of the same position of the light shield film and transparent film is implemented at the second mask pattern making.

At this writing time, a plurality of writing alignment marks used for the alignment of the patterning of the second semitransparent film are written and formed in the non-transfer area of the mask (not shown).

Subsequently, if necessary in view of the properties of the resist used, a baking step may be added after exposure. Then, the resist is developed by a given developing solution, and rinsed to form a resist pattern 106 for the light shield film (FIG. 2(d)).

Then, the light shield film 102 exposed out of the resist pattern 106 for the light shield film is etched to form a light shield film pattern 107 (FIG. 2(e)), and the remaining resist is stripped off to obtain a substrate 108 having the light shield film pattern (FIG. 2(f)). In the light shield film pattern 107, there is only the boundary formed at which the light shield film area is in direct contact with the semitransparent film area: at this stage, a portion of the light shield layer to be etched at the same position as the semitransparent film remains un-etched.

The light shield film 102 may be etched either wet or dry. When it comes to a photomask for image display devices as mentioned above, however, equipment and material for drying etching cost too much, and large area dry etching gets worse in terms of uniform etching; wet etching is preferable. When the light shield film 102 is of the chromium type, preference is given to a wet etchant of the cerium nitrate type.

In the embodiment here, the substrate 108 having the light shield pattern may be inspected after the patterning step of the first film to correct it for detects, if required. When the film of the chromium type is used for the light shield film, the conventional technique for the inspection and correction of the chromium type photomasks may be used. By implementing the steps of pattern size inspection for the light shield film pattern and pattern defects and, if necessary, the correction step, it is possible to prevent the defective substrate from being passed out to the next step, resulting in some considerable drops of the percentage of rejects and, hence, contributing to mask cost reductions.

Then, a semitransparent film 109 is formed all over the surface of the substrate 108 having the light shield film pattern (FIG. 2(g)).

The semitransparent film 109 here is preferably made of the material of the same type as that of the aforesaid light shield film 102. If the light shield film 102 is made of the chromium type material as already mentioned, the semitransparent film 109 may contain chromium plus one or two or more of oxygen, nitrogen, carbon, etc. and have a relatively high transmittance: its film composition and thickness may be optimized in such a way as to have a reduced reflectance upon stacking on the light shield layer.

The semitransparent film containing oxygen, nitrogen, carbon, etc. has its absorbance changing with composition: the desired transmittance and antireflection function are achievable by controlling its film thickness and composition at the same time. For instance, when a chromium oxide film is used for the semitransparent film 109, it is used in the film thickness range of about 5 nm to 150 nm.

The semitransparent film 109 is formed by vacuum film-formation techniques such as sputtering, as in the formation of the chromium light shield film.

Then, at the second mask pattern making step, the second or semitransparent film 109 is patterned to form a semitransparent film pattern in alignment with the underlying light shield film pattern 107. That is, a resist such as photosensitive resist compatible with an aligner such as a laser aligner is coated on the semitransparent film 109, and after coating, baking is applied to it for a given time to form a resist film 110 for the semitransparent film (FIG. 3(h)).

Subsequently, the semitransparent film 109 is pattern written by means of an energy beam 111 such as laser light. At this writing time, an alignment mark for the first-layer light shield film is detected for alignment (FIG. 3(i)). In the invention, the alignment mark provided on the light shield film pattern 107 is easily detectable through the resist film 110 so that writing position precision is much more improved.

Then, if necessary in view of the properties of the resist used, a baking step may be added after exposure. Then, the resist is developed by a given developing solution, and rinsed to form a resist pattern 112 for the semitransparent film (FIG. 3(j)).

Figure 3H:
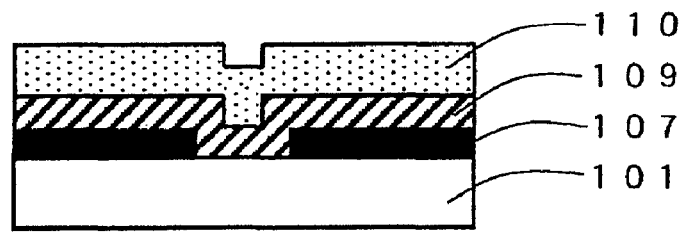
FIG. 3 is illustrative in sectional schematic of photomask fabrication process steps subsequent to FIG. 2.
Figure 3I:
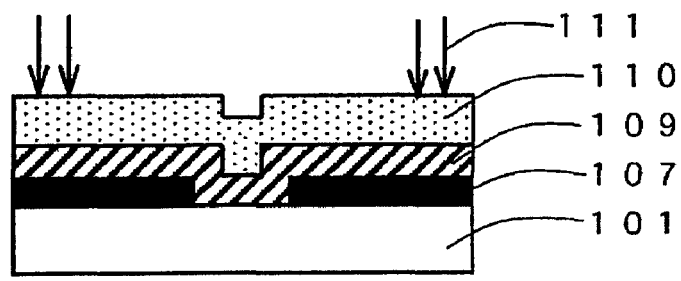
Figure 3J:
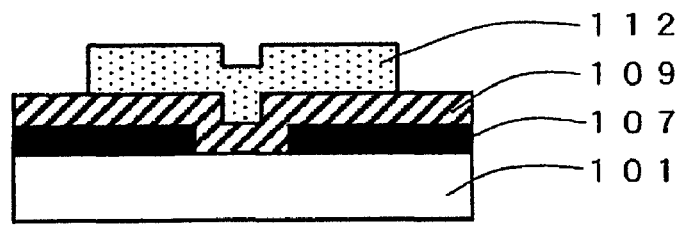
Figure 3K:
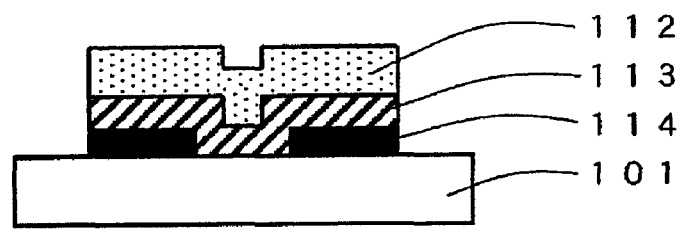

Then, a portion of the semitransparent film 109 exposed out of the resist pattern 112 for the semi-transparent film is etched followed by the etching of an exposed portion of the light shield film pattern 107, thereby forming a semitransparent film pattern 113 and a light shield film pattern 114 (FIG. 3(k)).

After the etching of the semitransparent film here, a site at which the underlying light shield film is exposed out is patterned by again etching the light shield film. Of course, the site of the light shield film to be again etched is different from the initially etched site. Further, when a semitransparent film of the same type as that of the light shield film is used, the semitransparent film and the light shield film can be etched back-to-back using the same etching solution so that the fabrication process can be curtailed with improvements in fabrication efficiency.

In the embodiment here, the light shield film is subjected to two pattern etchings to form the light shield film pattern; in the invention, however, it is understood that the light shield film pattern may be formed by one single pattern etching.

Figure 3L:
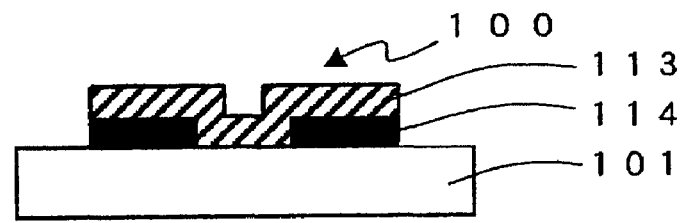

Then, the remaining resist pattern 112 for the semitransparent film is stripped off using a resist-dedicated stripper to obtain the gradated photomask 100 (FIG. 3(l)), after which the mask is inspected and, if required, corrected.

In FIG. 3(l), at one edge portion with the semitransparent film stacked and pattern etched on the light shield film, the sectional edge portions of the light shield layer and the semitransparent film are in alignment, and the semitransparent film is formed at another edge portion of the light shield pattern 114 with good step coverage.

Second Embodiment

The second embodiment is now explained. This embodiment is directed to a fabrication process using a generally used photomask blank having a layer of low reflectance previously provided on the light shield film.

FIG. 4 and FIG. 5 subsequent to it are illustrative in sectional schematic of another fabrication process steps for the inventive gradated photomask.

To fabricate the inventive gradated photomask according to the embodiment here, there is a double-layer photomask blank 220 readied up, in which a low-reflective film 203 is formed on a light shield film 202 on a transparent substrate 201 (FIG. 4(a)). For instance, an ordinary photomask blank with the light shield film 202 made of a chromium nitride film and the low-reflective film 203 made of a chromium oxide film may be used.

However, the low-reflective film 203 of the aforesaid photomask blank 220 has none of the given function as a semitransparent film; by the immediate use of the ordinarily used photomask blank, it is impossible to obtain the inventive gradated photomask.

The inventive gradated photomask takes on a form comprising a mixture of a light shield area with a light shield film and a semitransparent film stacked on a transparent substrate in that order, a semitransparent area where there is only a semitransparent film, and a transmissive area having neither a light shield film nor a semitransparent film.

Therefore, all the low-reflective film 203 on the light shield layer 202 is first etched off to obtain the substrate with the light shield film 202 exposed out (FIG. 4(b)). Etching for the low-reflective film 203 can be controlled by an etching solution and an etching time.

Then, the aforesaid substrate having the light shield film 202 exposed out is subjected to the first mask pattern making to pattern a part of the light shield film 202. That is, a resist such as a photosensitive resist compatible with an aligner such as a laser aligner is coated on the light shield layer 202, and after coating, baking is applied to it for a given time to form a resist film 204 of uniform thickness for the light shield film (FIG. 4(c)).

Then, pattern writing is applied to the resist film 204 on the light shield film (FIG. 4(d)). In the embodiment here, this pattern writing is implemented such that only a boundary at which the light shield film area comes in direct contact with the semitransparent film area to be formed at the post-step, thereby patterning a part of the light shield film 202. Pattern writing for the batch etching of the same position of the light shield film and transparent film is implemented at the second mask pattern making.

At this writing time, a plurality of writing alignment marks used for the alignment of the patterning of the second semitransparent film are written and formed in the non-transfer area of the mask (not shown).

Subsequently, if necessary in view of the properties of the resist used, a baking step may be added after exposure. Then, the resist is developed by a given developing solution, and rinsed to form a resist pattern 206 for the light shield layer (FIG. 4(e)).

Then, the light shield film 202 exposed out of the resist pattern 206 for the light shield film is etched to form a light shield film pattern 207 (FIG. 4(f)), and the remaining resist is stripped off to obtain a substrate 208 having the light shield film pattern (FIG. 4(g)). In the light shield film pattern 207, there is only the boundary formed at which the light shield film area is in direct contact with the semitransparent film area: at this stage, a portion of the light shield layer to be etched at the same position as the semitransparent film remains un-etched.

As described with reference to the first embodiment, the light shield film 202 may be etched either wet or dry, although wet etching is preferred. When the light shield film 202 is of the chromium type, preference is given to a wet etchant of the cerium nitrate type.

In the embodiment here, the substrate 208 having the light shield pattern may be inspected after the patterning step of the first film to correct it for defects, if required. When the film of the chromium type is used for the light shield film 202, the conventional technique for the inspection and correction of the chromium type photomasks may be used. By implementing that inspection step and, if necessary, the correction step, it is possible to prevent the defective substrate from being passed out to the next step.

Then, a semitransparent film 209 is formed all over the surface of the substrate 208 having the light shield film pattern (FIG. 5(h)). In the second embodiment, too, the material of the semitransparent film, its formation and its properties are the same as in the first embodiment.

Then, by the second mask pattern making, the second or semitransparent film 209 and the first film are patterned to form a semitransparent film pattern in alignment with the underlying light shield film pattern. That is, a resist such as a photosensitive resist compatible with an aligner such as a laser aligner is coated on the semitransparent film 209, and after coating, baking is applied to it for a given time to form a resist film 210 for the semitransparent film (FIG. 5(i)).

Subsequently, the resist film 210 for the semitransparent film is pattern written by an energy beam 211 such as laser light. At this writing, the alignment mark for the first-layer light shield film is detected for alignment (FIG. 5(j)).

Subsequently, if necessary in view of the properties of the resist used, a baking step may be added after exposure. Then, the resist is developed by a given developing solution, and rinsed to form a resist pattern 212 for the light shield film (FIG. 5(k)).

The semitransparent film 202 exposed out of the resist pattern 212 for the semitransparent film is etched. Subsequently, when there is a portion of the underlying light shield layer 207 exposed out, that portion is etched back-to-back, thereby forming a semitransparent film pattern 213 and a light shield film pattern 214 (FIG. 5(l)). The embodiment here is more preferred because the same type material is used for the light shield layer and the semitransparent film so that the batch patterning for the light shield film and semitransparent film can be implemented by the same technique.

In the embodiment here, the light shield pattern is formed by two patterning etching operations of the light shield film; in the invention, however, it is understood that the light shield film pattern may have been formed by one single pattern etching.

Then, the remaining resist pattern 212 for the semitransparent film is stripped off to obtain the gradated photomask 200 (FIG. 5(m)), followed by mask inspection and, if required, correction.

In FIG. 5(m), on the pattern etched stack side of the light shield area where there is the stack of light shield film pattern 212 and semitransparent film pattern 213, the light shield film pattern 214 and semitransparent film pattern 212 are subjected to batch etching by the same technique: there is a structure obtained, in which the edge portions of light shield film pattern 212 and semitransparent film pattern 213 lie in much the same position.

As for control of the transmittance and reflectance of the semitransparent film in the invention, the transmittance of the semitransparent film must be set at 15 to 85%, and the reflectance of the light shield area with the semitransparent film stacked on the light shield film must be set at less than 30%. Semitransparent, and light shield films, each meeting such conditions, are achievable by the adjustment of film quality and the selection of film thickness. One exemplary semitransparent film is a chromium oxide film, and one exemplary light shield film is a metallic chromium film. When it comes to the semitransparent film, its film quality is adjusted by varying sputtering conditions to adjust the degree of oxidization of chromium oxide, and when it comes to the light shield film, some additives are added to it. As well known, for instance, nitrogen is used to this end. Alternatively, its density is varied. Usually, apparent n (refractive index), and k (extinction coefficient) is adjusted by varying sputtering conditions to change crystallographic properties (grain diameter) or incorporating voids (air bubbles) in the film.

Figure 6:
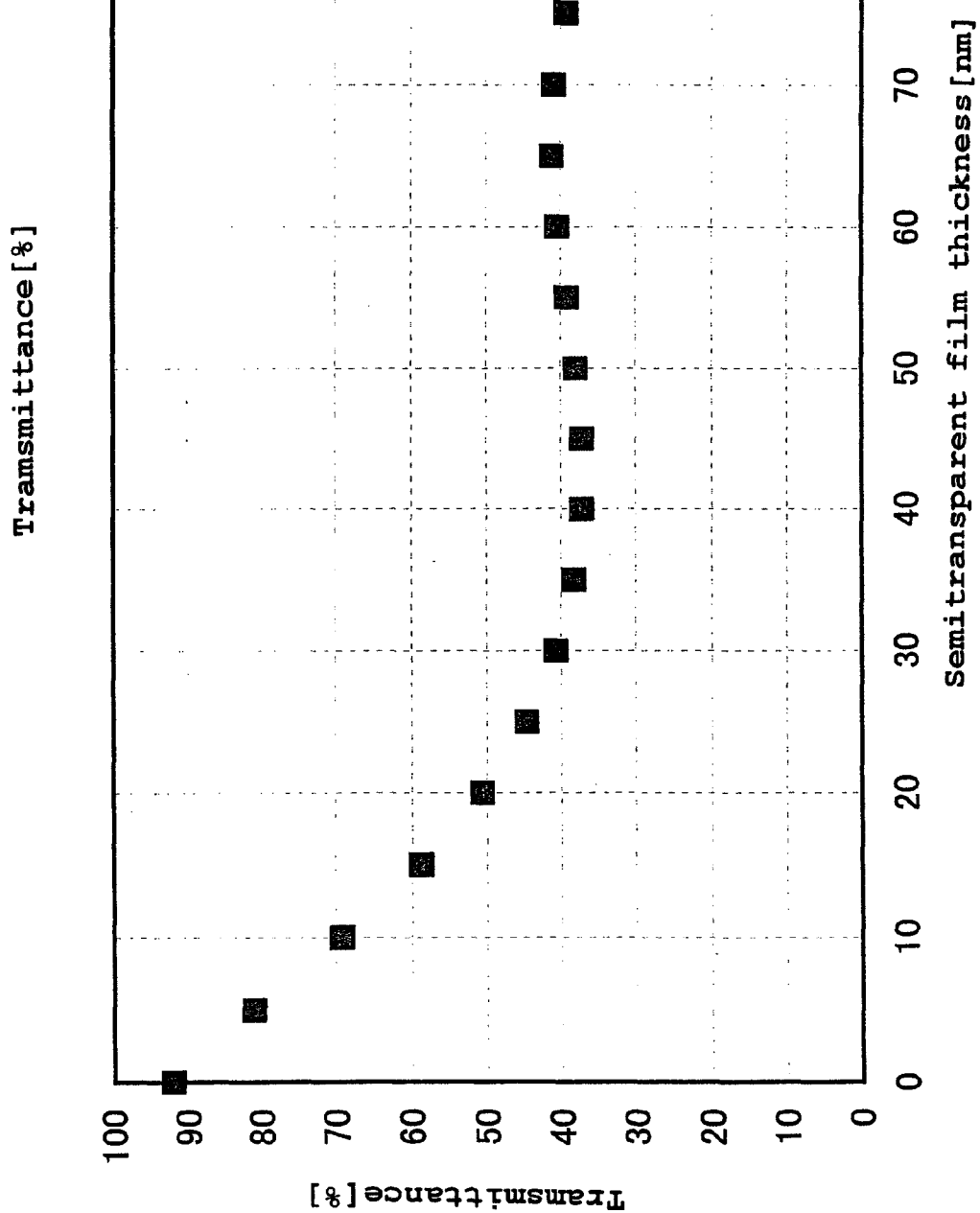
FIG. 6 is indicative of the transmittance of one example of the light shield film.
Figure 7:
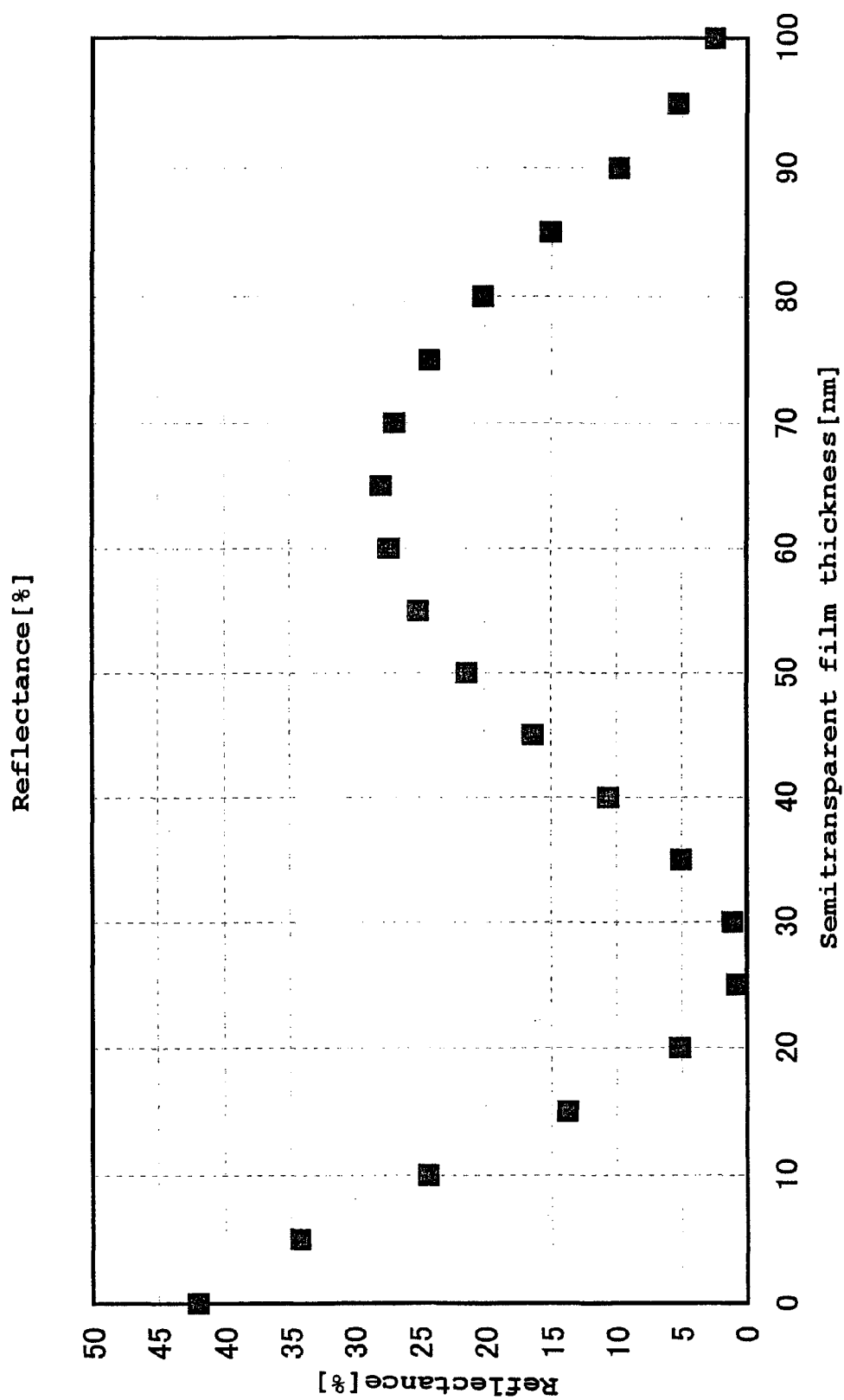
FIG. 7 is indicative of the reflectance of one exemplary light shield film and semitransparent film combination.
Figure 8A:
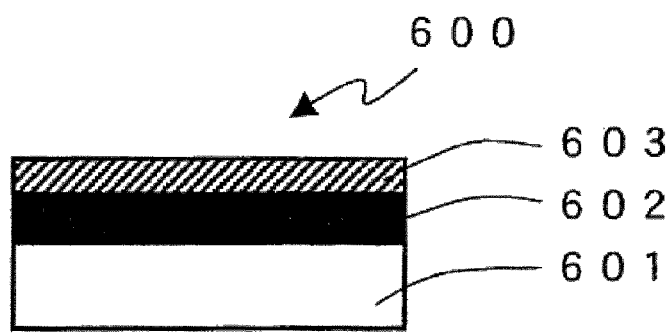
FIG. 8 is illustrative in section of process steps illustrating problems with a general-purpose photomask blank.
Figure 8B:
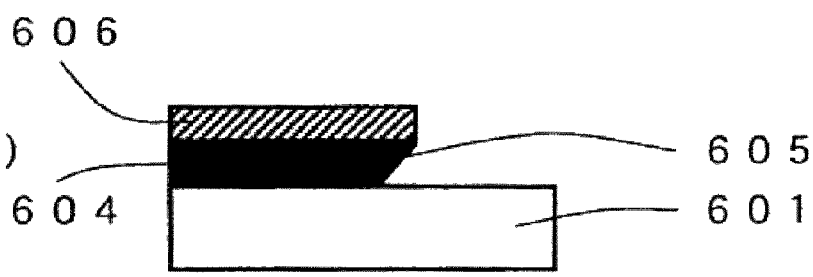
Figure 8C:
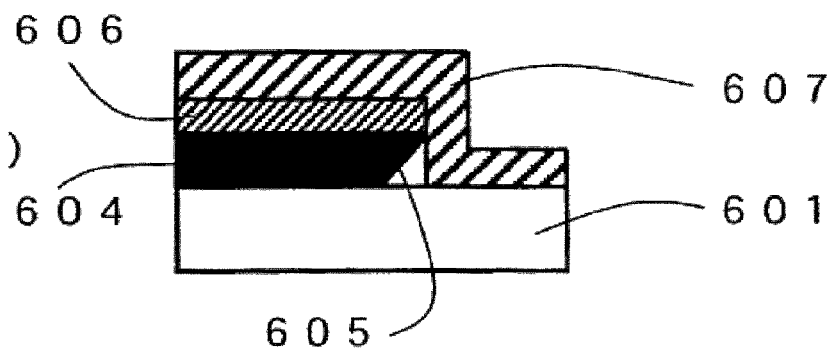

FIGS. 6 and 7 are illustrative of g-line (436 nm) vs. transmittance (semitransparent film) and reflectance (light shield film plus semitransparent film) in the event that the light shield film is a metallic chromium film (n=2.4, k=3.1) of 70 nm in thickness, and the semitransparent film is a chromium oxide film (n=2.8, k=0.3) having a thickness varying from 0 to 100 nm. From FIG. 6, it is found that when it is intended to obtain a semitransparent area having a transmittance of 40%, the semitransparent film is going to have a film thickness of 50 nm, but from FIG. 7, it is found that the then reflectance of the light shield area is about 21%: there is relatively good low reflection achievable. When it is intended to have a transmittance of 80%, on the other hand, the semitransparent film is going to have a film thickness of about 5 nm and the reflectance of the light shield area is going to be 34%: the low-reflection conditions are not that good. In this case, the film quality of the light shield film and the semitransparent film must be varied to vary n and k.

In the foregoing, the chromium type film is used as the material; however, it is understood that any thin film made of an ordinary mask material such as molybdenum silicide, tantalum, aluminum, silicon, silicon oxide, and silicon oxide nitride may be used.

While the aforesaid inventive gradated photomask has been described with reference to a two-gradation mask, it is understood that if pattern making, film formation and pattern remaking are repeated, it is possible to achieve a three- or multi-gradation photomask.

EXAMPLES

Example 1

A commercially available photoresist (ip-3500 made by Tokyo Ohka Kogyo Co., Ltd.) was coated at a thickness of about 380 nm on an ordinary photomask blank with a chromium light shield film of about 100 nm in thickness formed on an optically polished 330×450 nm synthetic quartz substrate, and baked for 15 minutes on a hotplate heated to 120° C. Then, the desired light shield film pattern was written on the photoresist, using a laser lithography system for photomasks, LRS11000-TFT3 made by Micronic Co., Ltd. The pattern written here is to eventually shield off light perfectly.

Then, development was implemented using an exclusive developer (NMD3 made by Tokyo Ohka Kogyo Co., Ltd.) to obtain a resist pattern for light shield films.

Then, the chromium film was etched using the resist pattern as an etching mask, and the remaining resist pattern was stripped off to obtain the desired light shield film pattern. Note here that a commercially available cerium nitrate type wet etchant (MR-ES made by The Inktec Co., Ltd.) was used for the etching of the chromium film. The etching time of the chromium film was about 60 seconds.

Then, the thus obtained substrate having the light shield film pattern was subjected to pattern size inspection and pattern defect inspection and, if required, pattern correction, and well washed, followed by sputtering of the semitransparent film, say, a chromium oxide film. The chromium oxide film had a thickness of about 30 nm and a transmittance of about 40% (at a g-line wavelength of 436 nm). This semitransparent film had an antireflection function, and an area comprising the light shield film and the semitransparent film had a reflectance of less than 30%.

Then, a commercially available photoresist (ip-3500 made by Tokyo Ohka Kogyo Co., Ltd.) was again coated at a thickness of 380 nm on that, and baked for 15 minutes on a hotplate heated to 120° C.

Subsequently, an image becoming a semitransparent film pattern was again written by the laser lithography system LRS11000-TFT3 made by Micronic Co., Ltd., and developed by an exclusive developer (NMD3 made by Tokyo Ohka Kogyo Co., Ltd.) to obtain a resist pattern for the semitransparent film. Note here that the lithographic system LRS11000 had an alignment writing function of forming a semitransparent film pattern in alignment with the position of the already formed light shield film pattern.

Then, the resist pattern was used as a mask to etch the semitransparent film with a commercially available cerium nitrate type wet etchant (MR-ES made by The Inktech Co., Ltd.) and, subsequently, the exposed light shield film was etched to obtain a semitransparent film pattern and an eventually etched light shield film pattern.

Finally, the remaining resist was stripped off to implement inspection steps such as pattern size inspection and defect inspection and, if required, pattern correction, thereby obtaining a photomask having the desired gradation.

Example 2

There was a commercially available photoresist blank of double-layer construction readied up, in which a chromium nitride film was formed as a light shield film on an optically polished 330×450 nm synthetic quartz substrate and a low-reflective chromium oxide film was provided on that. The chromium nitride film had a thickness of 70 nm and the chromium oxide film had a thickness of about 20 nm.

Then, all the low-reflective chromium oxide film of the aforesaid blank was etched off by a commercially available cerium nitrate type wet etchant (MR-ES made by The Inktech Co., Ltd.) to obtain a substrate on which the light shield film was exposed out.

Then, a commercially available photoresist (ip-3500 made by Tokyo Ohka Kogyo Co., Ltd.) was coated at a thickness of about 380 nm on the aforesaid exposed light shield film, and baked for 15 minutes on a hotplate heated to 120° C., followed by writing of the desired light shield pattern with a photomask laser lithography system LRS11000-TFT3.

Then, the light shield film pattern was developed by an exclusive developer (NMD3 made by Tokyo Ohka Kogyo Co., Ltd.) to obtain a resist pattern for the light shield film.

Then, the resist pattern for the light shield layer was used as an etching mask to etch the light shield film with a commercially available cerium nitrate type wet etchant (MR-ES made by the Inktech Co., Ltd.) thereby forming a light shield film pattern, and the remaining resist was stripped off to obtain a substrate having the light shield film pattern.

Then, the aforesaid substrate having the light shield film pattern was subjected to pattern size inspection and pattern defect inspection and, if required, pattern correction, and well washed, followed by sputtering of a semitransparent film, say, a chromium oxide nitride film. The chromium oxide nitride film had a thickness of about 20 nm and a transmittance of about 30% (at an i-line wavelength of 365 nm). This semitransparent film had an antireflection function, and an area comprising the light shield film and the semitransparent film had a reflectance of less than 30% at the i-line.

Then, a commercially available photoresist (ip-3500 made by Tokyo Ohka Kogyo Co., Ltd.) was again coated at a thickness of 380 nm on that, and baked for 15 minutes on a hotplate heated to 120° C., after which the desired semitransparent film pattern was written by a photomask laser lithography system LRS11000-TFT3 made by Micronic Co., Ltd.

Then, development was implemented by an exclusive developer (NMD3 made by Tokyo Ohka Kogyo Co., Ltd.) to obtain a resist pattern for the semitransparent film.

Then, the resist pattern was used as an etching mask to etch the chromium oxide nitride film with a commercially available cerium nitrate type wet etchant (MR-ES made by The Inktech Co., Ltd.) and, subsequently, the exposed light shield film was etched further followed by stripping of the remaining resist image, thereby obtaining the desired semitransparent film pattern and light shield film pattern.

Finally, inspection steps such as pattern size inspection and defect inspection and, if required, pattern correction were implemented to obtain a photomask having the desired gradation.

What we claim is:

1. A gradated photomask comprising a mixture of a light shield area including a light shield film having a desired pattern on a transparent substrate wherein a film forming said pattern is substantially opaque to photolithographic light, a semitransparent film that transmits said photolithographic light at a desired transmittance, and said light shield film and said semitransparent film are stacked on said transparent substrate in that order; a semi-transparent area where there is only said semi-transparent film; and a transmissive area where there is neither said light shield film nor said semitransparent film, characterized in that:

said semitransparent film has an antireflection function with respect to said photolithographic light.

2. The gradated photomask according to claim 1, characterized in that said semitransparent area wherein there is only said semitransparent film has a transmittance of 15% to 85% with respect to said photolithographic light.

3. The gradated photomask according to claim 1, characterized in that said light shield area wherein said light shield film and said semitransparent film are stacked in that order has a reflectance of less than 30% with respect to said photolithographic light.

4. The gradated photomask according to claim 1, characterized in that said semi-transparent film has an antireflection function with respect to a wavelength that at least one of g-line, h-line, i-line, KrF excimer laser, and ArF excimer laser has.

5. The gradated photomask according to claim 1, characterized in that said light shield film and said semitransparent film are each mainly composed of chromium.

6. The gradated photomask according to claim 5, characterized in that said light shield film comprises chromium or chromium oxide, and said semitransparent film comprises chromium oxide or chromium oxide nitride.

7. A process of fabricating a gradated photomask comprising a light shield film having a desired pattern on a transparent substrate wherein a film forming said pattern is substantially opaque to photolithographic light, and a semitransparent film that transmits said photolithographic light at a desired transmittance, characterized by comprising, in order described below, a step of providing a mask blank wherein said light shield film is formed on said transparent substrate,
a step of patterning said light shield film,
a step of forming a semitransparent film having an antireflection function with respect to said photolithographic light all over the surface of said transparent substrate having said patterned light shield film, and
a step of patterning said semitransparent film having an antireflection function.

8. A process of fabricating a gradated photomask comprising a light shield film having a desired pattern on a transparent substrate wherein a film forming said pattern is substantially opaque to photolithographic light, and a semitransparent film that transmits said photolithographic light at a desired transmittance, characterized by comprising, in order described below,
- a step of providing a mask blank of two films or a light shield film and a low-reflective film on said transparent substrate,
- a step of etching said low-reflective film to expose out said light shield film,
- a step of patterning said light shield film,
- a step of forming a semitransparent film having an antireflection function with respect to said photolithographic light all over the surface of said transparent substrate having said patterned light shield film, and
- a step of patterning said semitransparent film having an antireflection function.

9. The gradated photomask fabrication process according to claim 7, characterized by further comprising a step of re-patterning said exposed light shield film after the step of patterning said semi-transparent film having an antireflection function.

10. The gradated photomask fabrication process according to claim 7, characterized by further implementing mask pattern inspection for said light shield film and, if required, a correction step after the step of patterning said light shield film.

* * * * *